United States Patent
Liu (10) Patent No.: US 11,043,837 B2
(45) Date of Patent: Jun. 22, 2021

(54) INPUT POWER SUPPLY SELECTION CIRCUIT

(71) Applicant: Murata Manufacturing Co., Ltd., Nagaokakyo (JP)

(72) Inventor: Chui Pong Liu, Hong Kong (CN)

(73) Assignee: MURATA MANUFACTURING CO., LTD., Kyoto (JP)

( * ) Notice: Subject to any disclaimer, the term of this patent is extended or adjusted under 35 U.S.C. 154(b) by 102 days.

(21) Appl. No.: 16/502,413

(22) Filed: Jul. 3, 2019

(65) Prior Publication Data
US 2020/0014239 A1  Jan. 9, 2020

(30) Foreign Application Priority Data
Jul. 5, 2018 (CN) .......................... 201810735303.6

(51) Int. Cl.
*H02J 9/06* (2006.01)
*H02M 1/08* (2006.01)
*H02M 3/155* (2006.01)

(52) U.S. Cl.
CPC ................. *H02J 9/06* (2013.01); *H02M 1/08* (2013.01); *H02M 3/155* (2013.01)

(58) Field of Classification Search
None
See application file for complete search history.

(56) References Cited

U.S. PATENT DOCUMENTS

| | | | |
|---|---|---|---|
| 9,431,853 B2* | 8/2016 | Yeh | H02J 9/062 |
| 10,134,550 B2* | 11/2018 | Schicke, II | G01R 31/3278 |
| 2003/0090155 A1* | 5/2003 | Sanada | H02J 1/12 307/45 |
| 2018/0006446 A1* | 1/2018 | Guo | H02H 9/001 |

FOREIGN PATENT DOCUMENTS

| | | | | |
|---|---|---|---|---|
| EP | 3 340 429 A1 | 6/2018 | | |
| EP | 3340429 A1 * | 6/2018 | ............ | H02J 3/0073 |

* cited by examiner

*Primary Examiner* — Jared Fureman
*Assistant Examiner* — Joel Barnett
(74) *Attorney, Agent, or Firm* — Keating & Bennett, LLP (57) ABSTRACT

An input power supply selection circuit includes a load, at least one input power supply to provide an operation power supply for the load, an input selection circuit to select the at least one input power supply as the operation power supply for the load, a sensing and control module to control the input selection circuit to switch the operation power supply for the load, and a load switch branch to control the load to be connected or disconnected. The sensing and control module controls the load switch branch to be connected or disconnected, and when the load switch branch is disconnected, the load and the at least one input power supply are not electrically coupled. Therefore, a contact protection design is simplified and a switching capacity requirement of the load switch branch is lowered.

14 Claims, 12 Drawing Sheets

INPUT POWER SUPPLY SELECTION CIRCUIT

CROSS REFERENCE TO RELATED APPLICATIONS

This application claims the benefit of priority to Chinese Patent Application No. 201810735303.6, filed on Jul. 5, 2018, the entire disclosure of which is incorporated herein by reference.

BACKGROUND OF THE INVENTION

1. Field of the Invention

The present disclosure relates to an integrated circuit field, and more particularly, to an input power supply selection circuit.

2. Description of the Related Art

A certain power supply system is provided with more than one input power supply for redundancy. An input power supply selection circuit coupled to the power supply system usually includes a plurality of relay switches, and selects one of input power supplies for the operation of the power supply system. When a selected input power supply is determined to be problematic, the sensing and control module switches the problematic input power supply to a normal one to maintain operation of the power supply system.

If the power supply selection circuit includes a capacitive load and the source voltages of input power supplies before and after switching are at different phases, an electric arc is usually generated with the switch being operated with power on. Overheating of the switch and a contact sticking may be caused, which may result in a malfunction of the switch. Therefore, it is necessary to set a relay switch in the input power supply selection circuit, however, this increases a size and cost of the input power supply selection circuit and a design complexity of the related circuit.

SUMMARY OF THE INVENTION

Preferred embodiments of the present disclosure ensure zero current switching of the input selection switches and prevent malfunction of switches due to over-rating the switch contacts during switching actions, which is caused by the switch being operated with power on in an input power supply selection circuit.

A preferred embodiment of the present disclosure provides an input power supply selection circuit including a load, at least one input power supply to provide an operation power supply for the load, the operation power supply being a DC (direct current) power supply or an AC (alternating current) power supply, an input selection circuit to select the at least one input power supply as the operation power supply for the load, and a sensing and control module to control the input selection circuit to switch the operation power supply for the load, the input power supply selection circuit further including a load switch branch to control the load to be connected or disconnected, and including a first end and a second end, wherein the first end is connected with the load, the second end is connected with an output end of the input selection circuit. The sensing and control module controls the load switch branch to be connected or disconnected, and when the load switch branch is disconnected, the load and the at least one input power supply are not electrically coupled.

In some preferred embodiments, the sensing and control module determines whether the operation power supply malfunctions by comparing the output voltage of the input selection circuit with a first voltage range.

In some preferred embodiments, if the output voltage of the input selection circuit does not fall within the first voltage range, the sensing and control module determines that the operation power supply for the load malfunctions, and controls the input selection circuit to conduct a power supply switching.

In some preferred embodiments, prior to controlling the faulty operation power supply to be disconnected, the sensing and control module controls the load switch branch to be disconnected, the sensing and control module controls the load switch branch to be disconnected prior to controlling the input selection circuit to couple with a new operation power supply, and the sensing and control module controls the load switch branch to be connected after controlling the input selection circuit coupled with the new operation power supply.

In some preferred embodiments, the sensing and control module determines whether the input selection circuit malfunctions by comparing a voltage of the operation power supply with the output voltage of the input selection circuit.

In some preferred embodiments, if a voltage difference between the voltage of the operation power supply and the output voltage of the input selection circuit is greater than a first threshold, the sensing and control module controls the load switch branch to be disconnected.

In some preferred embodiments, the load switch branch includes a load switch to control the load to be connected or disconnected.

In some preferred embodiments, the load switch branch includes a semiconductor switch branch connected in parallel with the load switch.

In some preferred embodiments, the semiconductor switch branch includes a first semiconductor switch and a second resistor connected in series, and a second semiconductor switch connected in parallel with the first semiconductor switch and the second resistor.

In some preferred embodiments, after switching the operation power supply, the sensing and control module controls the first semiconductor switch to be connected, when detecting that the difference between the output voltage of the input selecting circuit and the load voltage is less than a second threshold, the sensing and control module controls the second semiconductor switch and the load switch to be connected, and the first semiconductor switch and the second semiconductor switch to be disconnected sequentially.

In some preferred embodiments, the input selection circuit includes at least one set of input selection switches connected with the at least one input power supply and the load correspondingly, wherein each set of input selection switches includes at least one input selection switch.

In some preferred embodiments, the input selection circuit includes at least one single-pole double-throw switch, connected with the at least one input power supply and the load correspondingly.

In some preferred embodiments, the input selection circuit further includes at least one isolation switch connected with the at least one input power supply and the at least one single-pole double-throw switch correspondingly.

In some preferred embodiments, the load switch, each input selection switch, each single-pole double-throw switch, and each isolation switch are relay switches.

In some preferred embodiments, the input power supply selection circuit further includes a switching converter to perform a voltage conversion on an operation power supply, and including an input end and an output end, wherein the input end is connected with the sensing and control module, the load switch branch and the output end of the input selection circuit, and the output end is connected with both ends of the load, and an energy storage module to supply power to the load, prior to the switching action of the load switch branch, the sensing and control module controls the switching converter to change switching frequency and/or a duty ratio in the switching converter to reduce the operating power.

In some preferred embodiments, the load switch branch further includes an RC branch connected in parallel with the load switch, wherein the RC branch includes a first resistor and a first capacitor.

Each of the preferred embodiments of the present disclosure provide at least one of the following benefits.

In preferred embodiments of the present disclosure, the input power supply selection circuit includes a load switch branch to control the load to be connected or disconnected at an appropriate opportunity. According to the voltage of the at least one input power, the output voltage of the input selection circuit, and the load voltage, the sensing and control module controls the input selection circuit to switch the operation power supply for the load and controls the load switch branch to be connected or disconnected. Therefore, the input selection switches in the input selection circuit maintain a zero current state during the power switching, thus simplifying a contact protection design and reducing the switching capacity requirements. The hybrid design including semiconductors and mechanical relays in the load switch branch also greatly reduces the switching capacity requirements of the load switch.

Further, the sensing and control module determines whether the input selection circuit functions normally by comparing a voltage of the operation power supply with the output voltage of the input selection circuit to protect against electrical hazards.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
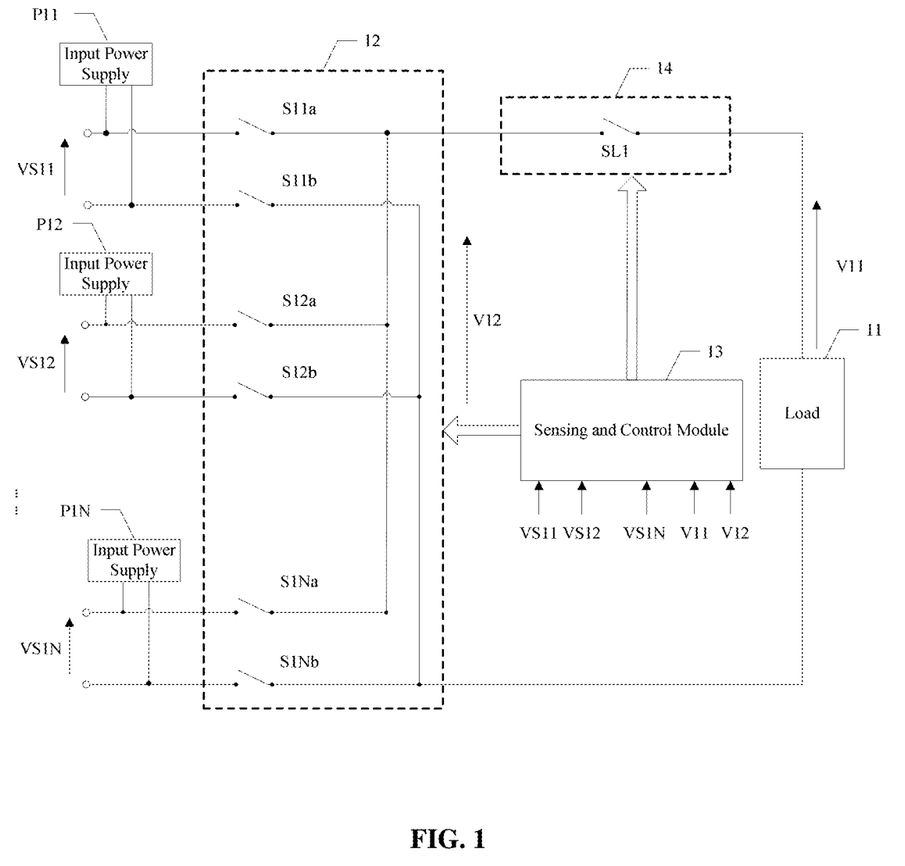
FIG. 1-FIG. 12 schematically illustrate structural diagrams of an input power supply selection circuit according to preferred embodiments of the present disclosure.

FIG. 1 schematically illustrates a structural diagram of an input power supply selection circuit according to a preferred embodiment of the present disclosure. The input power supply selection circuit includes a load 11, at least one input power supply (P11-P1N), an input selection circuit 12, a sensing and control module 13, and a load switch branch 14.

In some preferred embodiments, the at least one input power supply (P11-P1N) is configured to provide an operation power supply for the load 11 and the sensing and control module 13, the input selection circuit 12 is configured to select one of the at least one input power supply (P11-P1N) as the operation power supply for the load, wherein the operation power supply is a DC (direct current) power supply or a AC (alternating current) power supply. The sensing and control module 13 is configured to control the input selection circuit 12 to switch the operation power for the load 11 according to voltages (VS11-VS1N) of the at least one input power supply, an output voltage V12 of the input selection circuit, and a load voltage V11. The load switch branch 14 includes a first end and a second end, wherein the first end is connected with the load 11 and the second end is connected with an output end of the input selection circuit 12. The load switch branch 14 is configured to control the load 11 to be connected or disconnected, the sensing and control module 13 is further configured to control the load switch branch 14 to be connected or disconnected, and when the load switch branch 14 is disconnected, the load 11 and the at least one input power supply (P11-P1N) are not electrically connected.

In some preferred embodiments, the input selection circuit 12 includes at least one set of input selection switches (S11a, S11b, ..., S1Na, S1Nb) coupled with the at least one input power supply (P11-P1N) and the load 11 correspondingly, wherein each set of input selection switches includes at least one input selection switch. In FIG. 1, each set of input selection switches includes two input selection switches, wherein the input selection switches S11a, S11b are connected with the input power supply P11 correspondingly, the input selection switches S12a, S12b are connected with the input power supply P12 correspondingly, the input selection switches S1Na, S1Nb are connected with the input power supply P1N correspondingly.

In some preferred embodiments, the output end of input selection circuit 12 is connected with the load 11 through the load switch branch 14. That is to say, one switch in each set of input select switches is connected with a first end of load 11 through the load switch branch 14, and the other switch is connected with a second end of the load 11. For example, the input selection switch S11a is connected with the first end of the load switch branch 14, and the input selection switch S11b is connected with the second end of the load 11.

In some preferred embodiments, the sensing and control module 13 receives at least one voltage (VS11-VS1N) of the at least one input power supply, the output voltage V12 of the input selection circuit, and the load voltage V11, and send a control signal to the input selection circuit 12 and the load switch branch 14 to control the input selection circuit 12 to switch the operation power of the load 11 and to control the load switch branch 14 to be connected and disconnected.

In some preferred embodiments, the load switch branch 14 includes a load switch SL1 that is configured to control the load 11 to be connected or disconnected.

In some preferred embodiments, the sensing and control module 13 determines whether the at least one input power supply (P11-P1N) malfunctions by receiving the output voltage V12. Specifically, the sensing and control module 13 determines whether the at least one input power supply (P11-P1N) is functions normally by comparing the output voltage V12 of the input selection circuit 12 with a first voltage range. The first voltage range may be set according to actual conditions. In some preferred embodiments, the first voltage range may be about 100V to about 250V, for example.

In some preferred embodiments, if the output voltage V12 of the input selection circuit 12 does not fall within the first voltage range, the sensing and control module 13 determines that the operation power supply of the load 11 malfunctions, and controls the input selection circuit 12 to conduct a power supply switching. Specifically, prior to controlling the faulty operation power supply to be disconnected, the sensing and control module 13 controls the load switch branch 14 to be disconnected, the sensing and control module 13 keeps the load switch branch 14 to be disconnected prior to controlling the input selection circuit 12 to couple with a new operation power supply prior to controlling the load switch branch 14 to be disconnected. And the sensing and control module 13 controls the load switch branch 14 to be connected after confirming the input selection circuit 12 to couple with the new operation power supply.

In some preferred embodiments, it is assumed that an input power supply P1K in the at least one input power supply is selected as the operation power supply of the load 11, when the sensing and control module 13 determines that the input power P1K malfunctions, for example, when a voltage VS1K of the operation power supply exceeds the first voltage range, the sensing and control module 13 checks whether there is other faultless input power supply. If there are more than one faultless input power supplies, the sensing and control module 13 selects a faultless input power supply based on a predetermined rule to replace the faulty input power supply as a new operation power supply of the load 11, for example, based on the predetermined rule, selects a faultless input power supply P1L to replace the faulty input power supply P1K as the operation power supply of the load 11.

When a power supply switching is to be carried out, the sensing and control module 13 first turns off the load switch SL1 in the load switch branch 14 to ensure that each input selection switch in the input selection circuit 12 is in a zero current state, and then detects the voltage difference between V12 and V11) at both sides of the load switch SL1 to ensure whether the load switch SL1 is completely disconnected. After the load switch SL1 is completely disconnected, the sensing and control module 13 turns off the input selection switches S1Ka and S1Kb, to cut off the corresponding faulty input power supply P1K under a state of zero current, and compares a voltage difference (V12, VS1K) between both sides of the input selection switch S1Ka to ensure whether the input selection switches S1Ka and S1Kb are completely disconnected. Thereafter, the sensing and control module 13 turns on the input selection switches S1La and S1Lb such that a faultless input power supply P1L functions as the operation power of the load 11, and compares a voltage difference between V12 and VS1L to ensure that the input power P1L is connected properly with the circuit through the input selection switches S1La and S1Lb. Thereafter, the sensing and control module 13 turns on the load switch SL11 to complete the power supply switching process. In the whole power supply switching process, the sensing and control module 13 continuously detects the voltages (VS11-VS1N) of the at least one input power supply, the output voltage V12 of the input selection circuit, and the load voltage V11 to ensure the power switching correctly.

The input selection switches maintain zero current state during the power supply switching, thus simplifying a contact protection design and switching capacity requirements of all the switches in the input selection circuit 12.

In some preferred embodiments, the sensing and control module 13 determines whether the input selection circuit is functioning normally by comparing the voltage VS1K of the operation power supply with the output voltage V12 of the input selection circuit. The sensing and control module 13 controls the load switch branch 14 to be disconnected if the difference between the voltage VS1K of the operation power supply and the output voltage V12 of the input selection circuit is greater than a first threshold. In some preferred embodiments, the first threshold may be about 5V, for example. In some preferred embodiments, if some switches in the input selection circuit 12 are malfunctioning, causing two live wires of different power supplies to be connected with the load 11 at a same time, a large voltage is generated, which may lead to a serious consequence. In the present preferred embodiment, when a malfunction occurs (i.e., the difference between the operation power supply voltage VS1K and the output voltage V12 of the input selection circuit is greater than the first threshold), the load switch branch 14 is first disconnected to avoid damage to the circuit.

Figure 2:
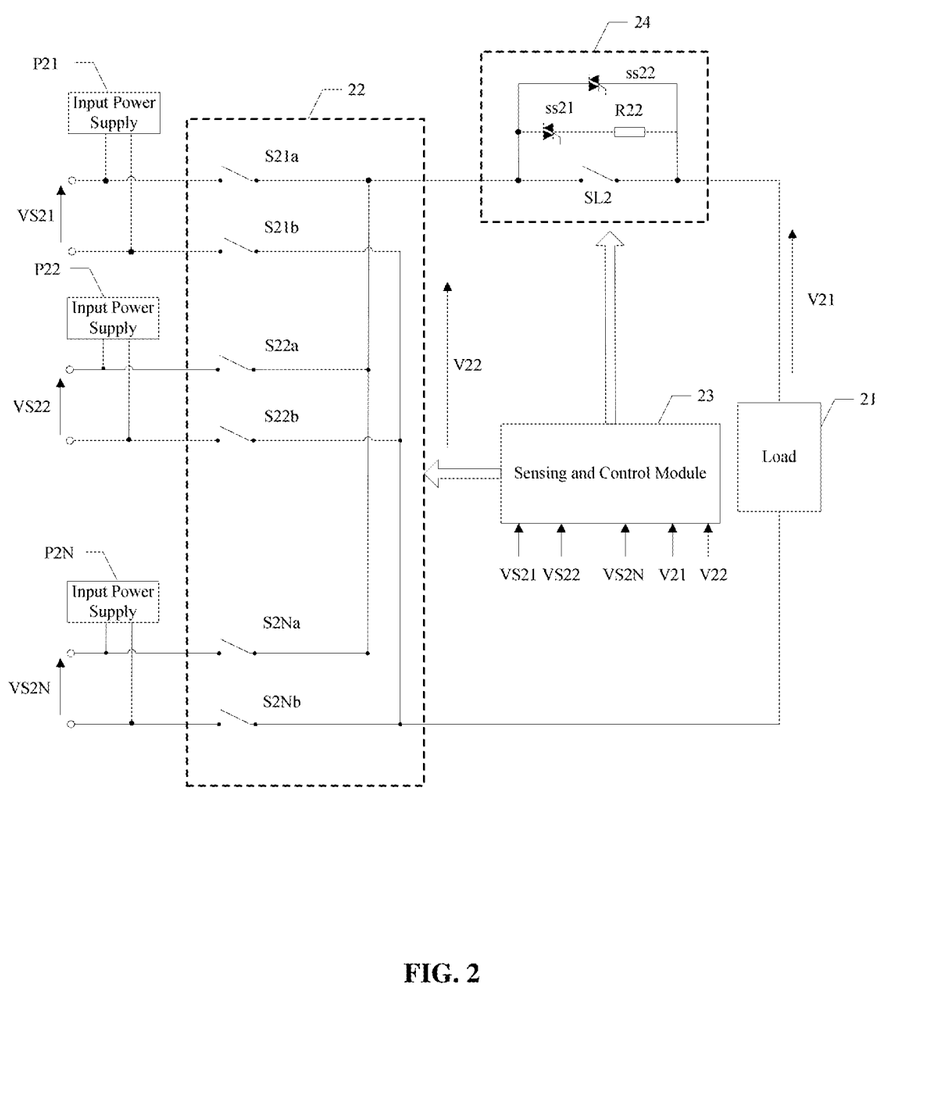

FIG. 2 schematically illustrates a structural diagram of an input power supply selection circuit according to a preferred embodiment of the present disclosure. The input power supply selection circuit includes a load 21, at least one input power supply (P21, P22, . . . , or P2N), an input selection circuit 22, a sensing and control module 23, and a load switch branch 24.

In some preferred embodiments, the input selection circuit 22 includes at least one set of input selection switches (S21*a*, S21*b*, . . . , S1Na, S1Nb) that are correspondingly connected with the at least one input power supply (P21-P2N) and the load 21. The load switch branch 24 includes a load switch SL2.

Compared with FIG. 1, the input power supply selection circuit shown in FIG. 2 differs mainly in that the load switch branch 24 further includes a semiconductor switch branch, which is connected in parallel with the load switch SL2 to further reduce a switching stress of the load switch SL2. The semiconductor switch branch includes a first semiconductor switch ss21 and a second resistor R22 connected in series, and a second semiconductor switch ss22 connected in parallel with the first semiconductor switch ss21 and the second resistor R22 in series. In some preferred embodiments, the semiconductor switch can be a Triode AC semiconductor switch (TRIAC), a MOS transistor, a transistor, a thyristor, an insulated gate bipolar transistor or a combination thereof. The remaining devices in the input power supply selection circuit shown in FIG. 2 are similar to the corresponding devices in the input power supply selection circuit shown in FIG. 1, which are not described in detail herein.

In some preferred embodiments, a process that the sensing and control module 23 conducting the power supply switching is similar to the process that the sensing and control module 13 conducting the power supply switching in FIG. 1, except for the connection step of the first semiconductor switch ss21. After the input selection switches in the input selection circuit 22 completes the corresponding switching operation (i.e., a faulty power supply is disconnected and a new faultless power supply is connected) in the zero current state, if the load switch SL2 is directly turned on, the circuit may generate high surge current when the load 21 is a capacitive device and V22 and V21 are at a high voltage difference, which may affect the circuit safety and reliability. Therefore, in some preferred embodiments, after the input selection switch completes the corresponding switching operation, the sensing and control module 23 turns on the first semiconductor switch ss21, so that the faultless input power supply P2L can apply a voltage to the load 21. The second resistor R22 in series with the first semiconductor switch ss21 can limit the current generated when the first semiconductor switch ss21 turns on to an acceptable range.

After the first semiconductor switch ss21 is turned on, if it is detected that a difference between the output voltage V22 of the input selection circuit and a load voltage V21 is less than a second threshold, the sensing and control module 23 turns on the second semiconductor switch ss22 and the load switch SL2. In some preferred embodiments, the second threshold may be about 5V, for example. In some preferred embodiments, a connection speed of the second semiconductor switch ss22 is faster than a connection speed of the load switch SL2, so that the second semiconductor switch ss22 is turned on before the load switch SL2 is turned on, and a voltage drop of load switch SL2 is kept at a low level. When the load 21 is a capacitive device, a switching stress of the load switch SL2 is able to be greatly reduced. After that, the sensing and control module 23 turns off the first semiconductor switch ss21 and the second semiconductor switch ss22 sequentially.

Figure 3:
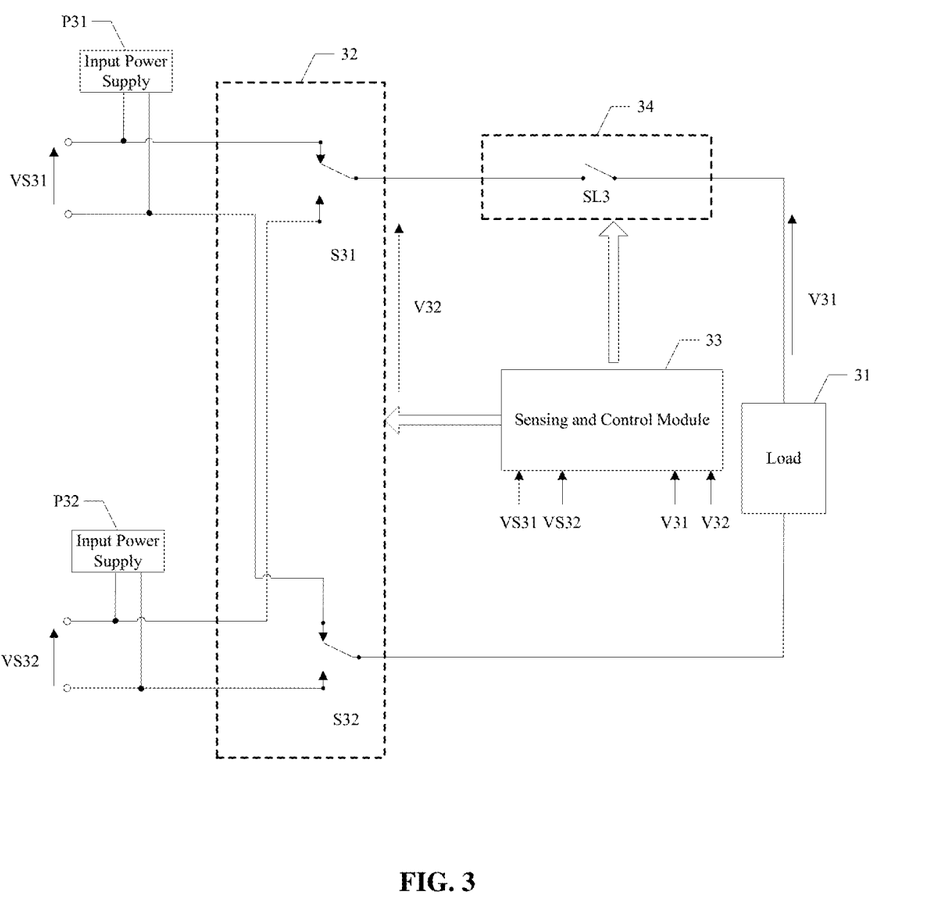

FIG. 3 schematically illustrates a structural diagram of an input power supply selection circuit according to a preferred embodiment of the present disclosure. The input power supply selection circuit includes a load 31, two input power supplies P31, P32, an input selection circuit 32, a sensing and control module 33, and a load switch branch 34. The load switch branch 34 includes a load switch SL3.

In some preferred embodiments, the input selection circuit 32 can include a first single-pole double-throw switch S31 and a second single-pole double-throw switch S32. The first single-pole double-throw switch S31 includes a first moving end connected with the input power supply P31, a second moving end connected with the input power supply P32, and a fixed end connected with the load switch SL3. The second single-pole double-throw switch S32 includes a first moving end connected with the input power supply P31, a second moving end connected with the input power supply P32, and a fixed end connected with the load 31. The remaining devices in the input power supply selection circuit shown in FIG. 3 are similar to the corresponding devices in the input power supply selection circuit shown in FIG. 1, which are not described in detail herein.

The adoption of the single-pole double-throw switch in the input selection circuit 32 instead of the input selection switch shown in FIG. 1 has the following advantages reduces the number of switches in the circuit. In the case where the number of input power supplies is 2, the input power supply selection circuit shown in FIG. 1 requires 4 input selection switches, while the input power supply selection circuit shown in FIG. 3 requires only 2 single-pole double-throw switches. Also, the single-pole double-throw switch structure avoids a short connection of the input power supply when the circuit is malfunctions, thus improving safety of the circuit. Furthermore, the single-pole double-throw switch structure accomplishes switching the power supply in one step by pulling a blade only, while the input selection switch structure requires two steps.

Figure 4:
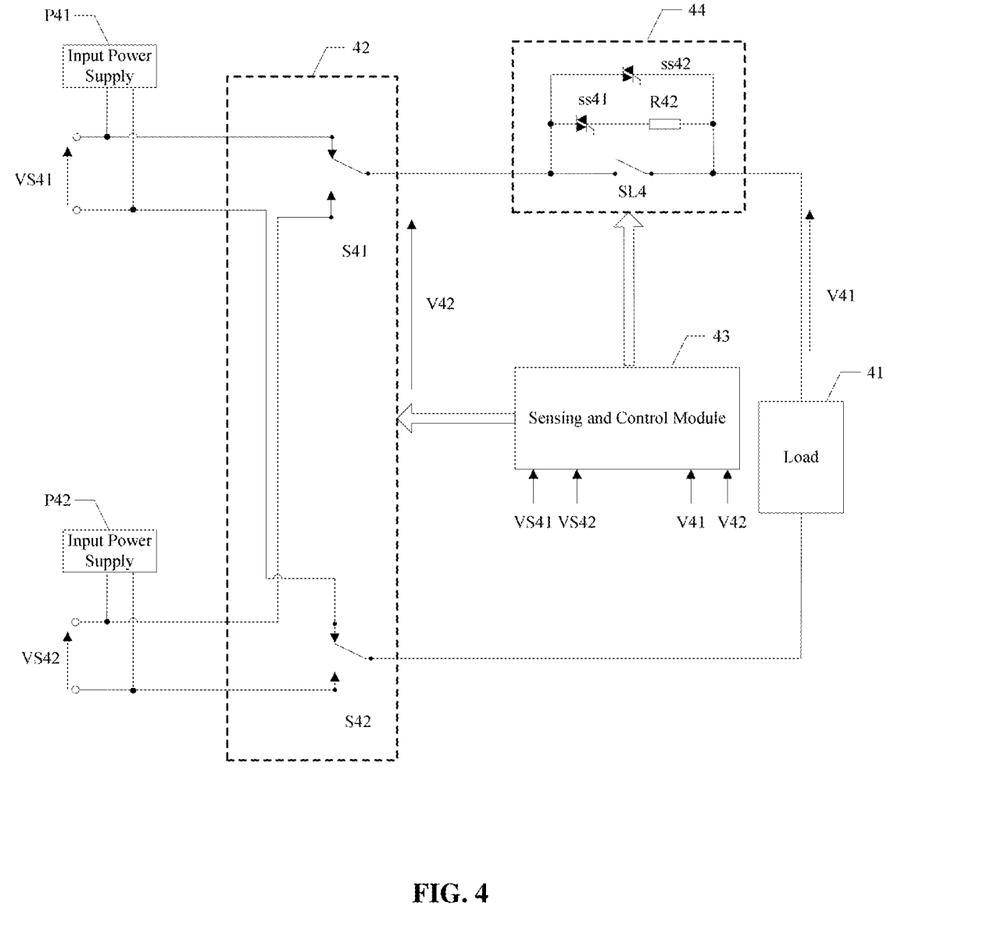

FIG. 4 schematically illustrates a structural diagram of an input power supply selection circuit according to a preferred embodiment of the present disclosure. The input power supply selection circuit includes a load 41, two input power supplies P41, P42, an input selection circuit 42, a sensing and control module 43, and a load switch branch 44. The input selection circuit 42 includes a first single-pole double-throw switch S41 and a second single-pole double-throw switch S42. The load switch branch 44 includes a load switch SL4. Other devices are similar to the corresponding devices shown in FIG. 2 and are not be described again here. Compared with FIG. 3, the load switch branch 44 in the input power supply selection circuit shown in FIG. 4 further includes a semiconductor switch branch including a first semiconductor switch ss41, a second resistor R42, and a second semiconductor switch ss42. An operating principle of the semiconductor switch branch is similar to the semiconductor switch branch shown in FIG. 2, and details are not described herein.

Figure 5:
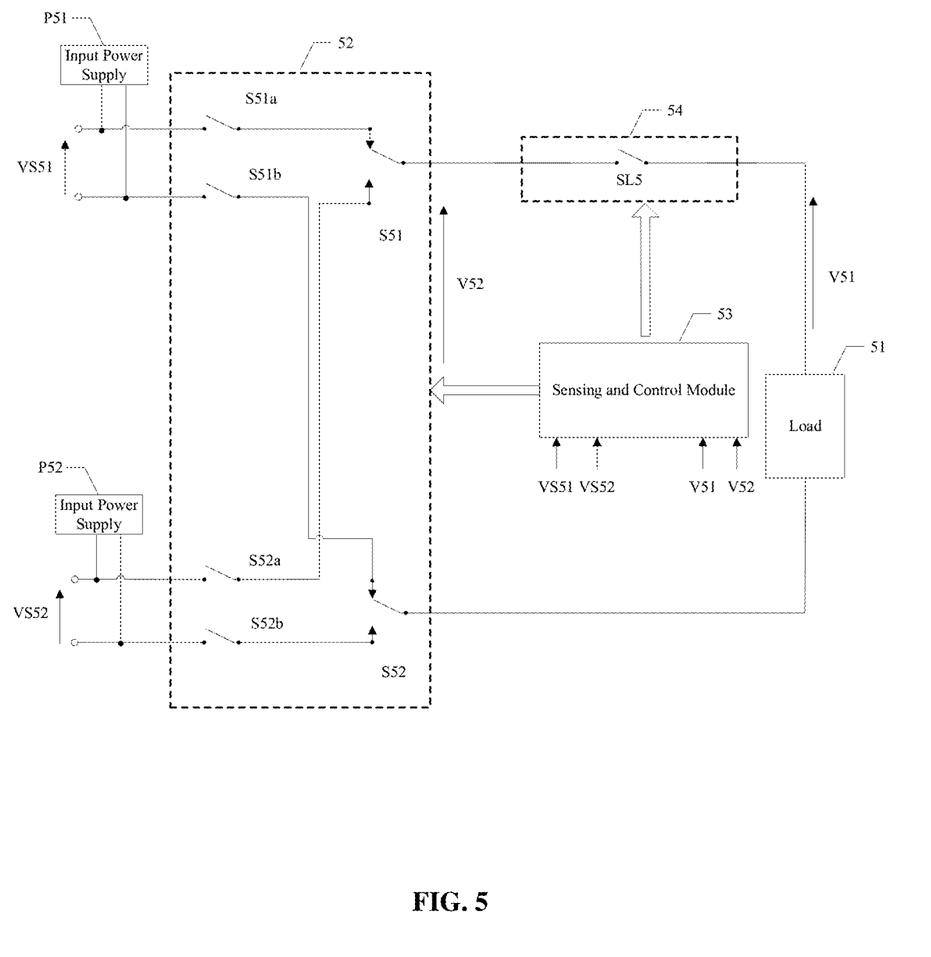

FIG. 5 schematically illustrates a structural diagram of an input power supply selection circuit according to a preferred embodiment of the present disclosure. The input power supply selection circuit includes a load 51, two input power supplies P51, P52, an input selection circuit 52, a sensing and control module 53, and a load switch branch 54. The input selection circuit 52 includes a first single-pole double-throw switch S51 and a second single-pole double-throw switch S52. The load switch branch 54 includes a load switch SL5.

In some preferred embodiments, the input selection circuit 52 further includes a first isolation switch S51a, a second isolation switch S51b, a third isolation switch S52a, and a fourth isolation switch S52b. The first isolation switch S51a includes a first end of connected with the input power supply P51, and a second end connected with a first moving end of the first single-pole double-throw switch S51, the second isolation switch S51b includes a first end connected with the input power supply P51, a second end connected with a first moving end of the second single-pole double-throw switch S52, the third isolation switch S52a includes a first end connected with the input power supply P52, and a second end connected with the a second moving end of the first single-pole double-throw switch S52, and the fourth isolation switch S52b includes a first end connected with the input power supply P52, and a second end connected with a second end of the second single-pole double-throw switch S52.

In some preferred embodiments, when the input power supply P51 is used as the operation power supply, the first isolation switch S51a and the second isolation switch S51b are turned on, and when the input power supply P52 is used as the operation power supply, the third isolation switch S52a and the fourth isolation switch S52b are turned on.

In some preferred embodiments, the load switch, each input selection switch, each single-pole double-throw switch, and each isolation switch herein may be relay switches.

In some preferred embodiments, the input power supply selection circuit has a safety isolation requirement, which requires a certain gap distance between the input power supplies, and the gap distance is affected by the contact gap distance of the relay switches. In FIG. 3, the contact gap distance between the input power supply P31 and the input power supply P32 is 1 due to the presence of the first single-pole double-throw switch S31 and the second single-pole double-throw switch S32. If there is a higher safety isolation requirement, the contact gap distance is able to be increased by connecting more relay switches in series.

Still referring to FIG. 5, the input selection circuit 52 adds 4 isolation switches to increase the contact gap distance between the input power supply P51 and the input power supply P52 to 2, which improves safety of the input power supply selection circuit. The remaining devices in the input power supply selection circuit shown in FIG. 5 are similar to the corresponding devices in the input power supply selection circuit shown in FIG. 3, and details are not described herein again.

Figure 6:
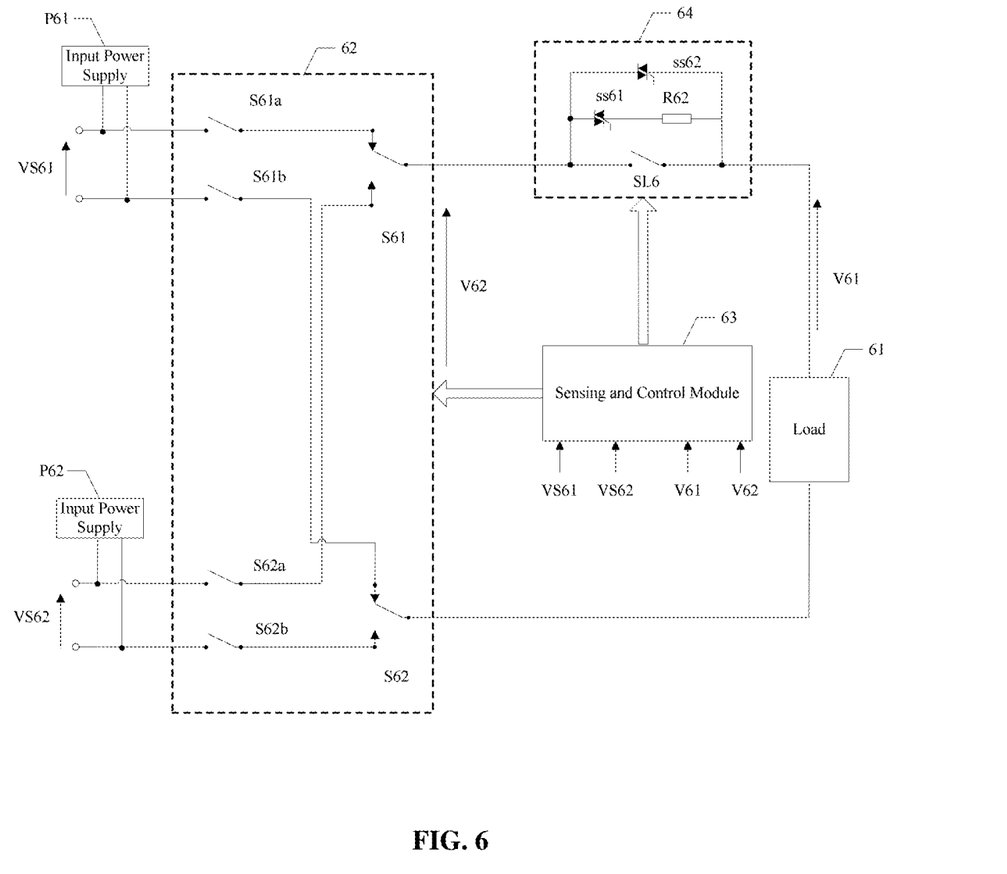

FIG. 6 schematically illustrates a structural diagram of an input power supply selection circuit according to a preferred embodiment of the present disclosure. The input power supply selection circuit includes a load 61, two input power supplies P61, P62, an input selection circuit 62, a sensing and control module 63, and a load switch branch 64. The input selection circuit 62 includes a first single-pole double-throw switch S61, a second single-pole double-throw switch S62, a first isolation switch S61a, a second isolation switch S61b, a third isolation switch S62a, and a fourth isolation switch S62b. The load switch branch 64 includes a load switch SL6.

Compared with FIG. 5, the load switch branch 64 of the input power supply selection circuit shown in FIG. 6 further includes a semiconductor switch branch including a first semiconductor switch ss61, a second resistor R62, and a second semiconductor switch ss62. The operating principle of the semiconductor switch branch is similar to that of the semiconductor switch branch shown in FIG. 2, and details are not described herein again. The remaining devices in the input power supply selection circuit shown in FIG. 6 are similar to the corresponding devices in the input power supply selection circuit shown in FIG. 5, and are details not described herein again.

Figure 7:
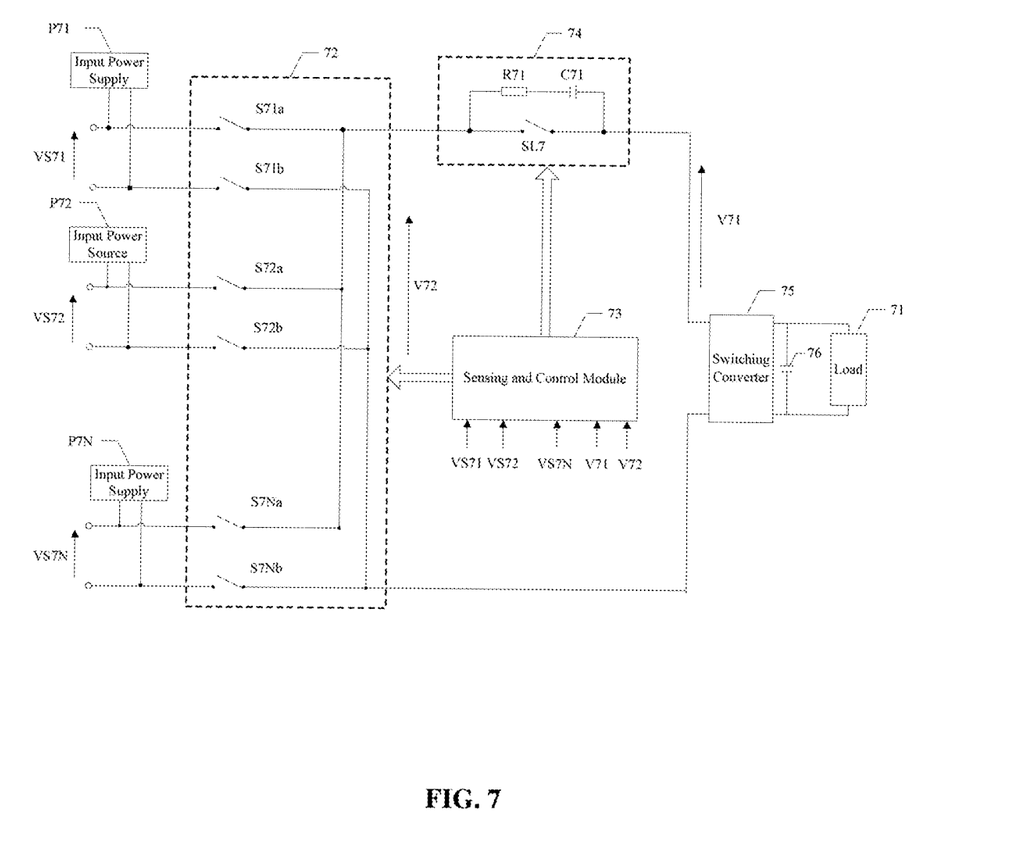

FIG. 7 schematically illustrates a structural diagram of an input power supply selection circuit according to a preferred embodiment of the present disclosure. The input power supply selection circuit includes a load 71, at least one input power supply (P71-P7N), an input selection circuit 72, a sensing and control module 73, and a load switch branch 74. The input selection circuit 72 includes at least one set of input selection switches (S71a, S71b, . . . , S7Na, S7Nb). The load switch branch 14 includes a load switch SL7.

In some preferred embodiments, the input power supply selection circuit further includes a switching converter 75 configured to perform a voltage conversion on the operation power supply. The switching converter 75 includes an input end connected with the sensing and control module 73, the load switch branch 74 and the output end of the input selection circuit 72, and an output end connected with both ends of the load 71.

Generally, an output of the at least one input power supply (P71-P7N) is unregulated, and some operations on the load 71 require some regulation of the output of the at least one input power supply (P71-P7N). In some preferred embodiments, the sensing and control module 73 may control the switching converter 75 to control and regulate the voltage and current on the load 71, such as performing AC to DC or DC to AC conversions. Further, the sensing and control module 73 can control the switching converter 75 to boost the output of one input power supply (P71-P7N). Furthermore, the switching converter 75 further includes an energy storage module 76 that supplies power to the load 71. In some preferred embodiments, the energy storage module 76 may be a capacitor that provides a power hold-up time for the load 71. When the time required for switching among the input power supply (P71-P7N) is less than the power hold-up time provided by module 76, the load 71 is able to operate continuously without being affected by the failure of the input power supply.

In some preferred embodiments, prior to the switching action of the load switch branch 74 requested to be turned on or off, the sensing and control module 73 controls the switch converter 75 to disable operation or change the switch frequency and/or the duty ratio in order to reduce the operating power, thus reducing the requirement for the breaking capacity of the load switch branch 74.

In some preferred embodiments, the load switch branch 74 further includes an RC branch, when an inductance of the load 71 is high, configured to prevent a spike current generated when the switch SL7 is turned on or turned off. The RC branch is connected in parallel with the load switch SL7, and includes a first resistor R71 and a first capacitor C71. The first resistor R71 and the first capacitor C71 are connected in series. In some preferred embodiments, a resistance of the first resistor R71 and a capacitance of the first capacitor C71 may be determined according to characteristics of the load 71. For example, the resistance of the first resistor R71 may range from about 1 ohm to about 1000 ohms, for example, and the capacitance value of the first capacitor C71 may range from about 1 nanofarad to about 1 microfarad, for example. In one preferred embodiment, the resistance of the resistor R71 may be about 10Ω, and the capacitance of the first capacitor C71 can be about 4.7 nanofarads, for example. In some preferred embodiments, if the operation power supply is an AC power supply with about 220V, the capacitance of the first capacitor C71 may be small, therefore, the reactance of the RC branch is high, which is close to the open circuit for the DC current. If the voltage of the operation power supply is other values (e.g., about 110V AC), the capacitance of the first capacitor C71 may be adjusted accordingly.

Figure 8:
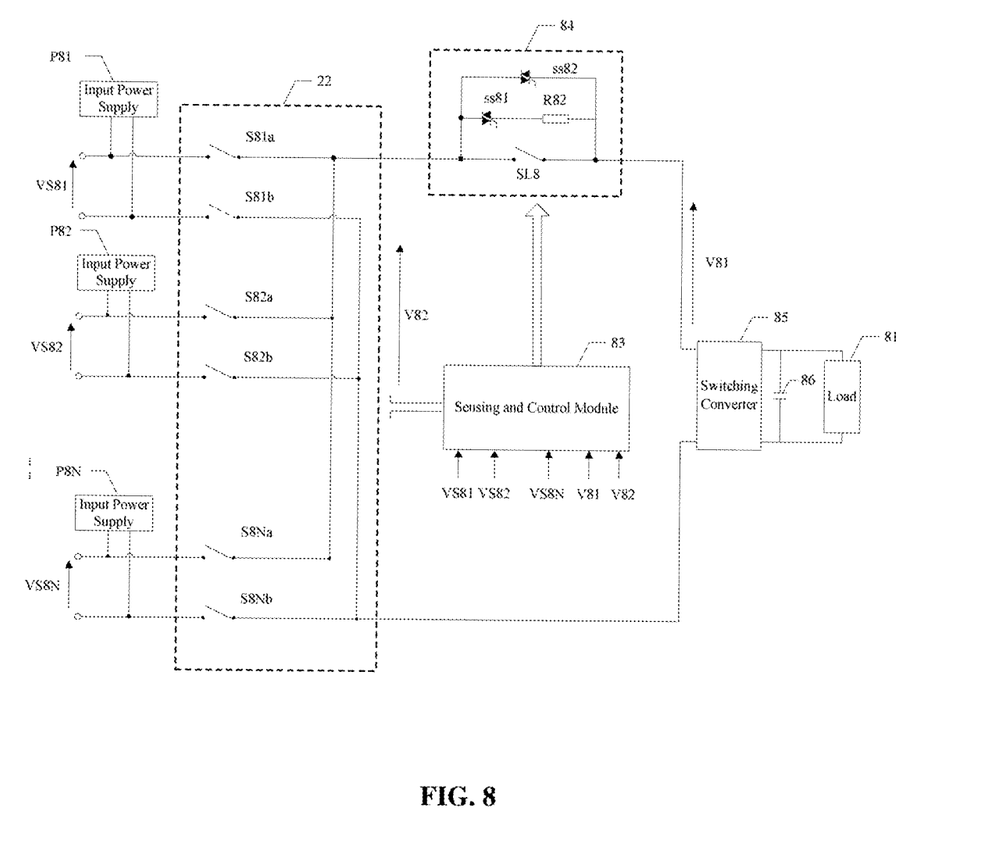

FIG. 8 schematically illustrates a structural diagram of an input power supply selection circuit according to a preferred embodiment of the present disclosure. The input power supply selection circuit includes a load 81, at least one input power supply (P81-P8N), an input selection circuit 82, a sensing and control module 83, and a load switch branch 84. The input selection circuit 82 includes at least one set of input selection switches (S81a, S81b, . . . , S8Na, S8Nb). The load switch branch 84 includes a load switch SL8, a first semiconductor switch ss81, a second semiconductor switch ss82, and a second resistor R82. The above-mentioned devices are similar to the corresponding devices shown in FIG. 2 and details are not described herein again. Compared with FIG. 2, the input power supply selection circuit shown in FIG. 8 further includes a switching converter 85 and an energy storage module 86, the operating principle is similar to that described above, and details are not described herein again.

Figure 9:
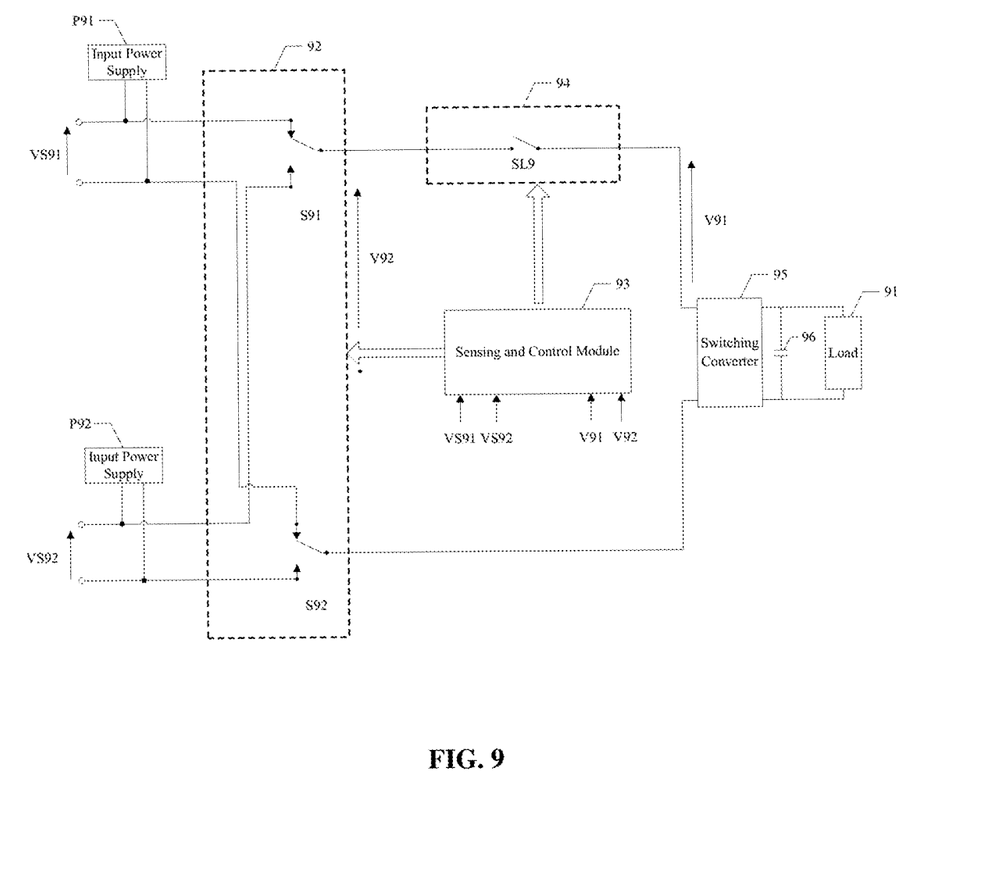

FIG. 9 schematically illustrates a structural diagram of an input power supply selection circuit according to a preferred embodiment of the present disclosure. The input power supply selection circuit includes a load 91, at least one input power supply (P91-P9N), an input selection circuit 92, a sensing and control module 93, and a load switch branch 94. The input selection circuit 92 includes a first single-pole double-throw switch S91 and a second single-pole double-throw switch S92. The load switch branch 94 includes a load switch SL9. The above-mentioned devices are similar to the corresponding devices shown in FIG. 3, and details are not described herein again. Compared with FIG. 3, the input power supply selection circuit shown in FIG. 9 further includes a switching converter 95 and an energy storage module 96, the operating principle thereof is similar to that described above, and details are not described herein again.

Figure 10:
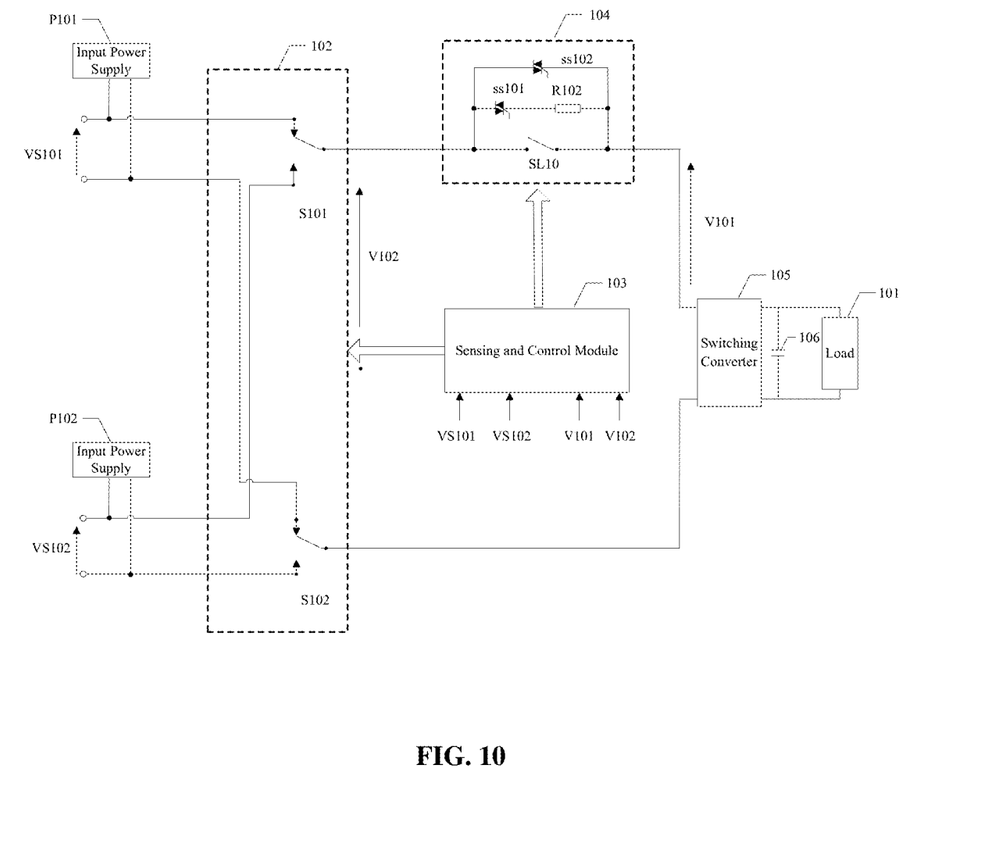

FIG. 10 schematically illustrates a structural diagram of an input power supply selection circuit according to a preferred embodiment of the present disclosure. The input power supply selection circuit includes a load 101, at least one input power supply (P101-P10N), an input selection circuit 102, a sensing and control module 103, and a load switch branch 104. The input selection circuit 102 includes a first single-pole double-throw switch S101 and a second single-pole double-throw switch S102. The load switch branch 104 includes a load switch SL10, a first semiconductor switch ss101, a second semiconductor switch ss102, and a second resistor R102. The above-mentioned devices are similar to the corresponding devices shown in FIG. 4, and details are not described herein again. Compared with FIG. 4, the input power supply selection circuit shown in FIG. 10 further includes a switching converter 105 and an energy storage module 106, the operating principle is similar to that described above, and details are not described herein again.

Figure 11:
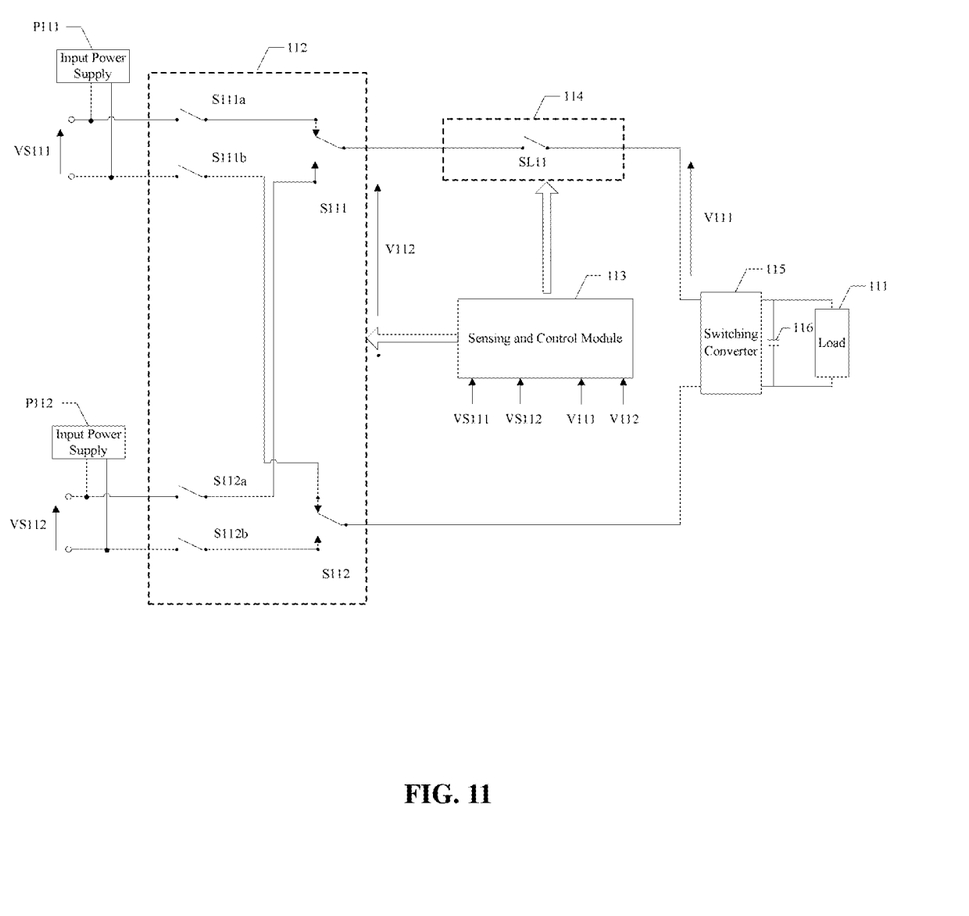

FIG. 11 schematically illustrates a structural diagram of an input power supply selection circuit according to a preferred embodiment of the present disclosure. The input power supply selection circuit includes a load 111, at least one input power (P111-P11N), an input selection circuit 112, a sensing and control module 113, and a load switch branch 114. The input selection circuit 112 includes a first single-pole double-throw switch S111, a second single-pole double-throw switch S112, and isolation switches (S111a, S111b, S112a, and S112b). The load switch branch 114 includes a load switch SL11. The above-mentioned devices are similar to the corresponding devices shown in FIG. 5, and details are not described herein again. Compared with FIG. 5, the input power supply selection circuit shown in FIG. 11 further includes a switching converter 115 and an energy storage module 116, the operating principle is similar to that described above, and details are not described herein again.

Figure 12:
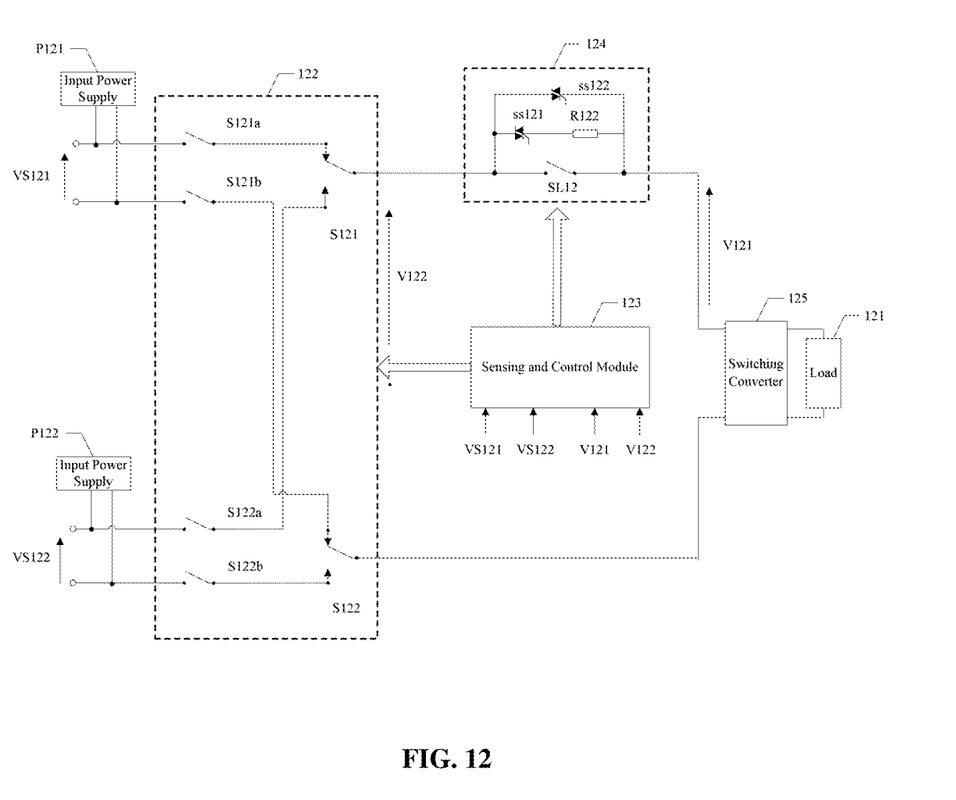

FIG. 12 schematically illustrates a structural diagram of an input power supply selection circuit according to a preferred embodiment of the present disclosure. The input power supply selection circuit includes a load 121, at least one input power supply (P121-P12N), an input selection circuit 122, a sensing and control module 123, and a load switch branch 124. The input selection circuit 122 includes a first single-pole double-throw switch S121, a second single-pole double-throw switch S122, and isolation switches (S121a, S121b, S122a, and S122b). The load switch branch 124 includes a load switch SL12, a first semiconductor switch ss121, a second semiconductor switch ss122, and a second resistor R122. The above-mentioned devices are similar to the corresponding devices shown in FIG. 6, and details are not described herein again. Compared with FIG. 6, the input power supply selection circuit shown in FIG. 12 further includes a switching converter 125 and an energy storage module 126, the operating principle is similar to that described above, and details are not described herein.

Although the present disclosure has been disclosed above with reference to preferred embodiments thereof, it should be understood that the present disclosure is presented by way of example only, and not limitation. Those skilled in the art may modify and vary the preferred embodiments without departing from the spirit and scope of the present disclosure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An input power supply selection circuit comprising:
    a load;
    at least one input power supply to provide an operation power supply for the load, the operation power supply being a direct current power supply or an alternating current power supply;
    an input selection circuit to select the at least one input power supply as the operation power supply for the load; and
    a sensing and control module to control the input selection circuit to switch the operation power supply for the load; wherein
    the input power supply selection circuit further comprises a load switch branch to control the load to be connected or disconnected, the load switch branch including a first end and a second end, the first end being connected with the load, the second end being connected with an output end of the input selection circuit;
    the sensing and control module controls the load switch branch to be connected or disconnected, and when the load switch branch is disconnected, the load and the at least one input power supply are not electrically coupled; and
    the sensing and control module determines whether the input selection circuit malfunctions by comparing a voltage of the operation power supply with an output voltage of the input selection circuit, and if a voltage difference between the voltage of the operation power supply and the output voltage of the input selection circuit is greater than a first threshold, the sensing and control module controls the load switch branch to be disconnected.

2. The input power supply selection circuit according to claim 1, wherein the sensing and control module determines whether the operation power supply malfunctions by comparing the output voltage of the input selection circuit with a first voltage range.

3. The input power supply selection circuit according to claim 2, wherein if the output voltage of the input selection circuit does not fall within the first voltage range, the sensing and control module determines that the operation power supply for the load malfunctions, and controls the input selection circuit to conduct a power supply switching.

4. The input power supply selection circuit according to claim 3, wherein
    prior to controlling the faulty operation power supply to be disconnected, the sensing and control module controls the load switch branch to be disconnected;
    the sensing and control module controls the load switch branch to be disconnected prior to controlling the input selection circuit to couple with a new operation power supply; and
    the sensing and control module controls the load switch branch to be connected after controlling the input selection circuit coupled with the new operation power supply.

5. The input power supply selection circuit according to claim 1, wherein the load switch branch includes a load switch to control the load to be connected or disconnected.

6. The input power supply selection circuit according to claim 5, wherein the load switch branch includes a semiconductor switch branch connected in parallel with the load switch.

7. The input power supply selection circuit according to claim 6, wherein the semiconductor switch branch includes:
    a first semiconductor switch and a second resistor connected in series; and
    a second semiconductor switch connected in parallel with the first semiconductor switch and the second resistor.

8. The input power supply selection circuit according to claim 7, wherein after switching the operation power supply, the sensing and control module turns on the first semiconductor switch;

when detecting that a difference between the output voltage of the input selecting circuit and the load voltage is less than a second threshold, the sensing and control module turns on the second semiconductor switch and the load switch, and then the first semiconductor switch and the second semiconductor switch are turned off sequentially.

9. The input power supply selection circuit according to claim 5, further comprising:

a switching converter to perform a voltage conversion on the operation power supply and including an input end and an output end, the input end being connected with the sensing and control module, the load switch branch and the output end of the input selection circuit, and the output end being connected with both ends of the load; and an energy storage module to supply power to the load; wherein prior to the switching action of the load switch branch, the sensing and control module controls the switching converter to change a switching frequency and/or a duty ratio in the switching converter to reduce the operating power.

10. The input power supply selection circuit according to claim 9, wherein the load switch branch includes an RC branch, connected in parallel with the load switch, and the RC branch includes a first resistor and a first capacitor.

11. The input power supply selection circuit according to claim 1, wherein the input selection circuit includes:

at least one set of input selection switches connected with the at least one input power supply and the load correspondingly; wherein each set of input selection switches comprises at least one input selection switch.

12. The input power supply selection circuit according to claim 1, wherein the input selection circuit includes at least one single-pole double-throw switch connected with the at least one input power supply and the load correspondingly.

13. The input power supply selection circuit according to claim 12, wherein the input selection circuit includes at least one isolation switch connected with the at least one input power supply and the at least one single-pole double-throw switch correspondingly.

14. The input power supply selection circuit according to claim 13, wherein each single-pole double-throw switch and each isolation switch are relay switches.

* * * * *